US009935422B2

(12) United States Patent
Komissarov et al.

(10) Patent No.: US 9,935,422 B2
(45) Date of Patent: Apr. 3, 2018

(54) HIGH-POWER LASER DIODE PACKAGING METHOD AND LASER DIODE MODULE

(71) Applicants: Alexey Komissarov, Charlton, MA (US); Dmitriy Miftakhutdinov, Worcester, MA (US); Pavel Trubenko, Westborough, MA (US); Igor Berishev, Southborough, MA (US); Nikolai Strougov, Dudley, MA (US)

(72) Inventors: Alexey Komissarov, Charlton, MA (US); Dmitriy Miftakhutdinov, Worcester, MA (US); Pavel Trubenko, Westborough, MA (US); Igor Berishev, Southborough, MA (US); Nikolai Strougov, Dudley, MA (US)

(73) Assignee: IPG PHOTONICS CORPORATION, Oxford, MA (US)

( * ) Notice: Subject to any disclaimer, the term of this patent is extended or adjusted under 35 U.S.C. 154(b) by 0 days.

(21) Appl. No.: 15/281,443

(22) Filed: Sep. 30, 2016

(65) Prior Publication Data
US 2017/0018906 A1 Jan. 19, 2017

Related U.S. Application Data

(63) Continuation of application No. PCT/US2015/022367, filed on Mar. 25, 2015.
(Continued)

(51) Int. Cl.
*H01S 5/022* (2006.01)
*H01S 5/024* (2006.01)

(52) U.S. Cl.
CPC ...... *H01S 5/02272* (2013.01); *H01S 5/02476* (2013.01)

(58) Field of Classification Search
CPC .............. H01S 5/02272; H01S 5/02476
See application file for complete search history.

(56) References Cited

U.S. PATENT DOCUMENTS

| 2009/0251697 | A1* | 10/2009 | Cutillas | G02B 6/4269 |
| | | | | 356/400 |
| 2014/0097232 | A1* | 4/2014 | Toyohara | B23K 35/26 |
| | | | | 228/256 |

* cited by examiner

*Primary Examiner* — Xinning Niu
(74) *Attorney, Agent, or Firm* — Yuri B. Kateshov, Esq.; Timothy J. King, Esq.

(57) ABSTRACT

A multi-layer laser diode mount is configured with a submount made from thermo- and electro-conductive material. One of the opposite surfaces of the submount supports a laser diode. The other surface of the submount faces and is spaced from a heatsink. The submount and heatsink are configured with respective thermal expansion coefficients ("TEC") which are different from one another. The opposite surfaces of the submount are electroplated with respective metal layers one of which is bonded to a soft solder layer. In one aspect of the disclosure, the mount is further configured with a spacer having the same TEC as that of the submount and bonded to the soft solder layer. A layer of hard solder bonds the spacer and heatsink to one another.
In a further aspect of the disclosure, the electroplated metal layer in contact with the other surface of the submount is hundred- or more micron thick. The soft solder is directly bonded to the heatsink.
In both aspects of the disclosure, a temperature of a p-n junction of the laser diode remains substantially constant within a 0 to 2° C. temperature range through a predetermined amount of several hundred of repeated thermo-cycles which is indicative of uncompromised integrity of the soft solder.

6 Claims, 3 Drawing Sheets

Related U.S. Application Data

(60) Provisional application No. 61/973,225, filed on Mar. 31, 2014, provisional application No. 61/973,237, filed on Mar. 31, 2014.

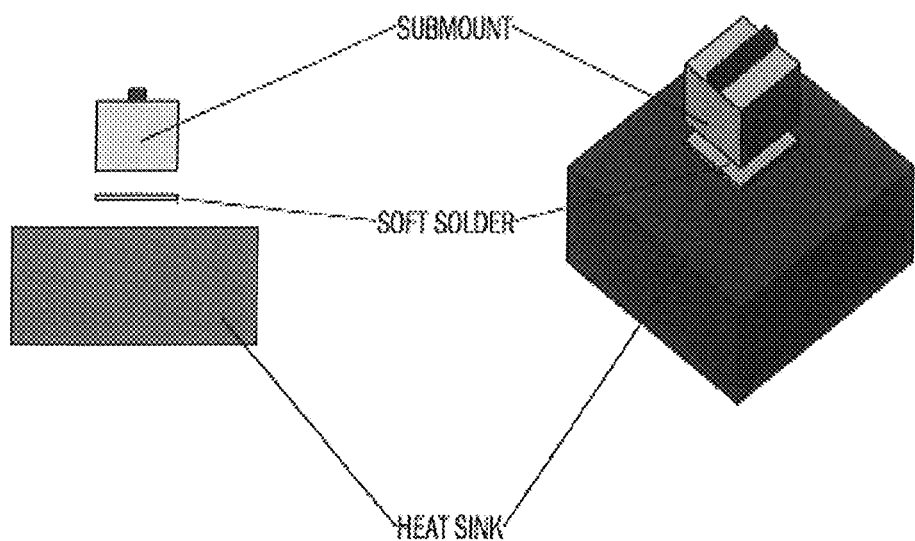
FIG. 1
Prior art
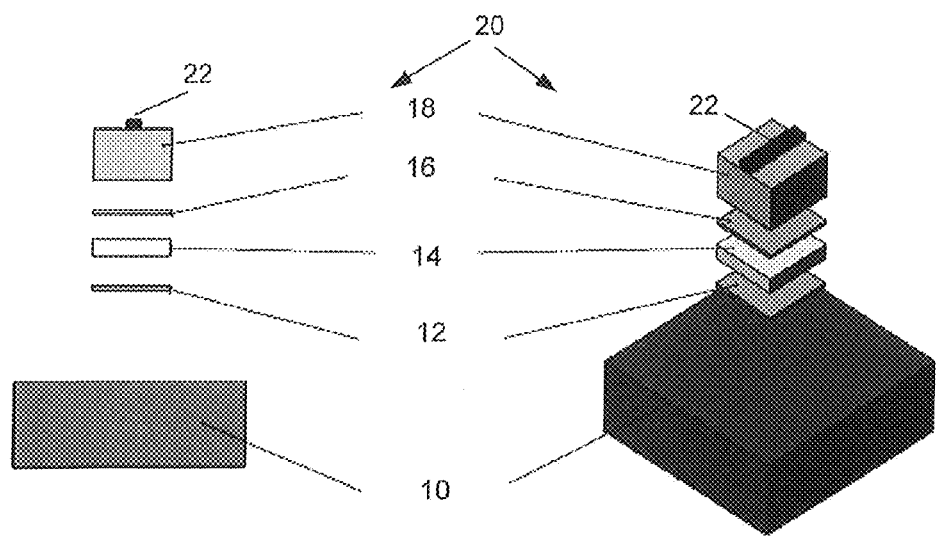
FIG. 2B
FIG. 2A

HIGH-POWER LASER DIODE PACKAGING METHOD AND LASER DIODE MODULE

BACKGROUND OF THE DISCLOSURE

Field of the Disclosure

This disclosure relates to the semiconductor laser technology and in particular to a high power laser diode module characterized by increased stability.

Prior Art

Rapid evolution of semiconductor laser technology has made the adoption of high-power laser diodes more readily affordable. The continuous pursue for higher lasing power calls for better thermal management capability in the packaging design to facilitate the controlled operation. As these laser diodes generate large amount of heat fluxes that can adversely affect their performances and reliability, a thermally-effective packaging solution is required to promptly remove the excessive heat generated in the laser diode to its surroundings.

For high-power applications, one needs to consider not only the thermal challenges, but also the mechanical integrity of the joints in the module. These poses significant packaging challenges as further discussed factors complicate the effort to create an ideal packaging design.

Referring to FIG. 1 illustrating a typical laser diode package, the heat generated in the laser diode is transferred to the ambient environment by attaching the diode onto a sub-mount. The laser diode must be attached to the package optimally to ensure an efficient heat transfer through the thermal interface. A thin thermal bonding interface, such as a soft solder, creates an effective heat dissipation channel through the die attachment process. Based on the illustration, to improve the thermal design of the laser diode package, it is desirable, among others, bringing the heat source, such as the diode laser, to the heat sink as close as possible, making the soft solder interface as thin as possible, increasing the thermal conductivity of the material, and providing an intimate thermal contact between the laser diode and the heat sink.

Thermal bonding interfaces or solders are utilized in every part of a laser diode assembly due to their electrical interconnect, mechanical support and heat dissipation capabilities. These solders can be commonly categorized into two types: hard solder and soft solder. In general, the solder material must satisfy the following requirements:

Have the desired processing temperature to support high temperature operation

Reduce thermally induced stresses due to the mismatch of thermal expansion between the laser diode and heat sink Exhibit no/low deformation during its long-term operation Exhibit low electrical resistivity of a sub-mount-die solder to reduce Joules heating at high injection current.

Soft solder, commonly containing a large percentage of lead, tin and indium, has very low yield strength and incurs plastic deformation under stresses. Their capability to deform plastically helps to relieve a stress developed in the bonded structure. However, this makes a soft solder subject to thermal fatigue and creep rupture, causing long-term reliability problems.

Traditionally, as shown in FIG. 1, soft indium/Sn/Bi etc., —based solder is used to bond a heatsink to ceramic sub-mount. The thermal expansion coefficient ("TEC") of the heat sink made, for example, from copper, does not match that one of the sub-mount. The repeat on-off cycle in laser operations, further referred to as a thermal cycle, can cause mechanical stresses due to different TECs of respective sink and sub-mount which leads to the soft layer material cracking/shearing, etc., and/or indium migration. These defects initially lead to elevated temperatures of the diode. In time the layer of soft solder is destroyed which results in decoupling of the submount from the heatsink and eventual destruction of the laser diode from overheating. This is particularly relevant to high power lasers, as they have a large contacting surface between the die and heatsink and high temperature difference between on and off cycles.

Hard solder, on the other hand, has very high yield strength and thus incurs elastic rather than plastic deformation under stresses. Accordingly, it has good thermal conductivity and is free from thermal fatigue and creep movement phenomena. Regrettably, melting temperatures of known hard solders may be too high and may compromise the integrity of the submount to heat the sink attachment.

A need therefore exists for improved thermo-cycle-resistant laser diode packaging resulting in a high power stable laser diode module.

SUMMARY OF THE DISCLOSURE

In accordance with one aspect of the disclosure, the inventive laser diode package is configured with two extra heat dissipating layers inserted between the heatsink and ceramic sub-mount. One of the layers functions as a spacer between a layer of soft solder and a layer of hard solder, which in turn, is bonded to a heatsink. The spacer is made from material selected to have a TEC which substantially matches that one of the ceramic sub-mount. Accordingly, during a thermal cycle, the geometry of both the spacer and submount changes substantially uniformly which minimizes tensile/compressive forces detrimentally affecting the soft solder layer. With the disclosed configuration of the spacer, however, the applied forces are insufficient to compromise the integrity of the soft solder.

The layer of hard solder is used for bonding the spacer to the heatsink. The hard solder is practically insusceptible to the non-uniform deformation of sandwiching layers of material with respective different TECs, which in this case the materials of the spacer and heatsink, respectively. Yet during joining the spacer to the heatsink, the elevated temperatures do not affect the integrity of the soft solder and die.

In a further aspect of the disclosure, the package includes a layer of highly plastic homogeneous metal which is electro-plated or directly bonded on the ceramic submount before the latter is bonded to the heatsink by using a layer soft solder. In contrast to the known prior art typically tending to have a thin metal layer not exceeding 1-2 microns, the metal layer of the disclosed structure is at least 10 micron thick and has a CTE differing from that of the submount. However, the plasticity of the plated or directly bonded metal compensates thermally induced stresses while its thickness substantially increases its useful life.

Based in the foregoing, the basic structure of the disclosed multi-layer laser diode mount is configured with a submount having one surface supporting a diode laser. The structure further includes a heatsink spaced from and facing a surface of the submount opposite the one surface. The submount and heatsink are configured with respective thermal expansion coefficients ("TEC") differing from one another. A metal layer of this structure is deposited over and in contact with the opposite surface of the submount and is about hundreds of microns. A soft solder layer is bonded to the metal layer and coupled to the heatsink so that a temperature of a p-n junction of the diode laser remains substantially constant through a predetermined amount of repeated thermo-cycles of up to at least several hundred cycles with a temperature differential ΔT within each cycle exceeding one hundred ° C.

The p-n junction of above describer structure of the disclosed mount operates at the temperature remaining constant in a 0 to 2° C. temperature range over the predetermined amount of repeated thermo-cycles. Preferably the temperature of the p-n junction remains below 1° C. over the predetermined amount of repeated thermo-cycles.

The basic structure of the mount further includes a spacer made from material with a TEC matching that of the submount and bonded to the soft solder layer, and a hard solder layer located between and bonded to the spacer and heatsink. These additional components operate so that the specified temperature of the p-n structure which varies between 0 and 2° C. and preferably below 1° C. remains unchanged.

BRIEF DESCRIPTION OF THE DRAWINGS

The above and other features will become more readily apparent from the following specific description accompanied by the drawings, in which:

FIG. 1 is an exploded view of a typical diode laser package;

FIGS. 2A and 2B are respective isometric and side exploded views of the inventive diode laser package in accordance with one aspect of the disclosure;

SPECIFIC DESCRIPTION

Figure 3:
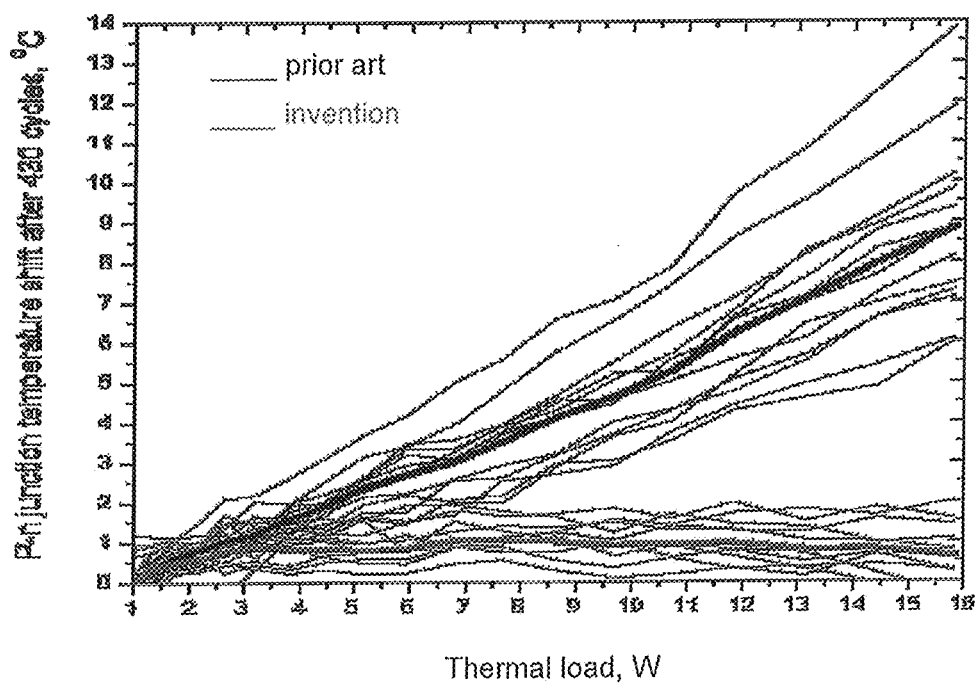
FIG. 3 illustrates the dependence of the temperature of P-N junction change of the diode laser from a thermal load applied to the diode laser which is packaged in accordance FIGS. 2A and 2B.

Reference will now be made in detail to embodiments of the invention. Wherever possible, same or similar numerals are used in the drawings and the description to refer to the same or like parts or steps. The drawings are in simplified form and are not to precise scale. Unless specifically noted, it is intended that the words and phrases in the specification and claims be given the ordinary and accustomed meaning to those of ordinary skill in the diode and fiber laser arts. The word "couple" and similar terms do not necessarily denote direct and immediate connections, but also include mechanical and optical connections through free space or intermediate elements.

Thermal management, mechanical stress, and material defects introduced by the mounting/packaging process are critical issues which need to be resolved in order to achieve reliable laser performance at higher levels of power. Besides the operating temperature itself, an important factor responsible for the ageing of diode lasers is thermo-mechanical stress. These high stress levels are caused by the packaging process and are minimized by the disclosed structure embodiments of which are fully disclosed hereinbelow in conjunction with FIGS. 2-4.

FIGS. 2A and 2B illustrate one of the embodiments of inventive laser diode package 20. A diode laser ("DL") 22 is bonded to a metal layer plated upon the diode-supporting surface of a submount 18. The layer of soft solder 16 provides a reliable contact between the opposite metalized side of sub-mount 18 and a spacer 14. The material of spacer 14 is selected to have a thermal expansion coefficient ("TEC") substantially matching that of sub-mount 18, whereas the geometry of spacer 14 is similar to that of submount 18 that may be several hundred-micron thick. The entire submount structure is further bonded to a heat sink 10 by means of a hard solder layer 12.

In general, when current is driven through DL 22, its temperature increases. If the bond between submount 18 and heatsink 10 is good, the temperature rise will be smaller because heat is conducted away from the DL; if the bond is poor, the temperature rise will be larger because the heat builds up in the chip. The materials typically used for manufacturing submount 18 in high power diode laser applications include BeO and AlN ceramics. The heatsink 10 is typically made of copper or another metal with thermo- and electro-conductivity characteristics close to those of copper.

Regardless of the materials used for respective heatsink 10 and submount 18, there is the mismatch between their respective TECs. This can cause high amounts of thermo-mechanical stress on soft solder 16. A common ductile solder is lead, tin and indium and their respective alloys, such as indium tin, which are classified as soft solders because of their plasticity. Accordingly, the ductile properties of soft solders, such as indium, are used to compensate for the mismatch caused by plastic deformation (creeping).

However, because of the repeat on/off thermo-cycles each lasting tens of minutes, the soft solder interface material develops voids. The primary concern with voids involves the loss of thermal conductivity within the soft solder interface. Voids can cause hotspots by creating areas of poor heat dissipation paths. Accordingly, voids in the soft solder interface not only limit the thermal dissipation capability but also deteriorate the electrical and mechanical properties of the joint. This, in turn, may lead to separation of the submount with the DL on it from the rest of the supporting structure and destruction of the DL.

The disclosed configuration minimizes the undesirable stresses on soft solder 16 and the formation of voids in the interface by inserting additional intermediate layers 14 and 12, respectively. The layer 14, further referred to as spacer, is selected with a TEC substantially matching that of sub-mount 18. Preferably, spacer 14 is made from the same material as that of submount 18. Relative displacement between spacer 14 and submount 18 during thermo-cycles is thus minimal. As a result, soft solder interface 16 enjoys a useful life which is considerably longer than that of the soft solder in prior art configuration of FIG. 1.

The spacer 14, of course, has a TEC differing from that of heatsink 10. Hard solder, in contrast to soft solder materials, has very high yield strength and thus incurs elastic rather than plastic deformation under stresses. Numerous alloys including Au—Sn, Au—Ge, Au—Si, etc., for example, eutectic Au80Sn20 alloys are usually adopted for high-power laser diode applications to overcome the reliability issues. Accordingly, hard solder interface 16 is relatively free from thermal fatigue and creep movement phenomena, well known to one of ordinary skill in the semiconductor arts.

The prior art, as discussed above, discloses numerous packaging configurations. Of course, every configuration is subject to rigorous tests. What is typically tested is how the wavelength of emitted light varies in response to a thermal load over a predetermined amount of thermo-cycles which typically includes hundreds of times and sometime may reach up to more than a thousand. Within each of the thermo-cycles, a temperature differential between the highest and lowest temperatures exceeds a 100° C. The dependence of wavelength from temperature increase of a p-n junction is well known for each particular operating wavelength. For example, for a DL emitting light at 970 nm, every degree corresponds to a wavelength shift of 0.3 nm towards longer wavelengths. The wattage, as known to one of ordinary skill, is a function of injection current applied to a DL, voltage across the latter minus optical power loss. Accordingly, the temperature variation of the active junction is a reliable indicator of the degradation of the joint between the submount surface, which faces a heatsink, and an adjacent layer. In the embodiment of FIGS. 2A and 2B, this joint is soft solder interface 16.

While there is no statutory universal standard test requiring a predetermined number of the repeated on-off cycles that are sufficient to call the tested DL package "good", the common practice in the semiconductor industry is well known. Namely, the temperature-based behavior of the p-n junction joint in question during the number of thermo-cycles varying between 300 and 1000 times is accepted as a reliable indicator of the quality of a package.

FIG. 3 illustrates a temperature of active junction in DL 22 as a function of thermal load over a predetermined amount repeated on-off cycles. The thermal load is a function of injection current, voltage across DL 22 and optical power losses. The latter includes the majority of unconverted power typically left in the device as waste heat or losses. The low power losses mean a lower junction temperature. The degradation rate of a high power laser diode typically increases exponentially with temperature: lower temperatures mean longer lifetimes.

The test results clearly show that the p-n junction temperature remains substantially continuous (varying within a 0-0.5° C. interval) in response to the increased thermal load over 430 thermo-cycles. In contrast, the structure of FIG. 1 tested under the same conditions as the inventive package, experiences the temperature increase close to 7.5° C. These results unequivocally illustrate the improved integrity of soft solder interface 18 in the inventive structure. The latter was tested under other different conditions including a 1000 thermo-cycle regime and invariably exhibited a substantially constant temperature of the p-n junction varying with a 0 to 1.5° C. range at the end of the test. In contrast, the prior art structure of FIG. 1 at the end of the test had the temperature change between 4 and 13° C.

Figure 4:
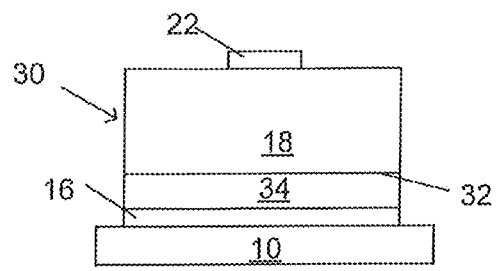
FIG. 4 illustrates a side view of the disclosed diode laser package in accordance with a further aspect of the disclosure.

Referring to FIG. 4, a further embodiment of the present disclosure includes a package 30 configured with heat sink 10 directly bonded to submount 18 via soft solder interface 16. However, by contrast with the prior art structure of FIG. 1, package 30 has the bottom surface 32 electro-plated with a relatively thick pure metal layer 34. The conventional practice in the packaging industry includes providing as thin a metal layer as possible, typically this thickness is about 1 micron. In contrast, metal layer 34 of the disclosed structure is at least 10 times thicker than that of the prior art and may reach up to tens of microns. The test results are very similar to the results shown in FIG. 3 which are obtained with the structure of FIGS. 2A-2B.

Figure 5A:
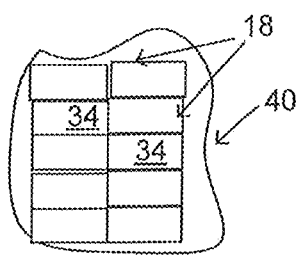
FIG. 5A is a bottom view of the base during a manufacturing process of the inventive package of FIG. 4.
Figure 5B:
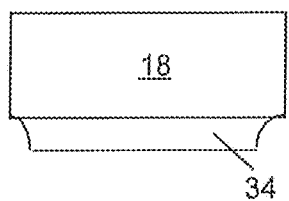
FIG. 5B illustrates a side view of the processed package of FIG. 4.

Referring to FIGS. 5A and 5B, typically, before bonding laser diodes to submount 18, a base 40 made from thermo-conductive material is electro-plated and then divided into a plurality of submounts 18. Since the bottom plated metal layer 34 of FIG. 4 is relatively thick, cutting of the base produces metal burrs. This is highly undesirable. The technique helping to avoid undesirable consequences of metal burrs is disclosed in co-owned application 61/653,083. In particular, To avoid the formation of the burrs, base 40 is processed so that the opposite edges of the bottom surface of each individual submount 18 do not have respective regions of plated metal layer 34.

Although the present disclosure has been described in terms of the disclosed example, numerous modifications and/or additions to the above-disclosed embodiments would be readily apparent to one skilled in the laser arts without departing however from the scope and spirit of the following claims.

The invention claimed is:

1. A multi-layer laser diode mount comprising:
a submount having one surface supporting a diode laser;
a heatsink spaced from and facing a surface of the submount opposite the one surface, the submount and heatsink being configured with respective thermal expansion coefficients ("TEC") differing from one another;
a metal layer deposited over and in contact with the opposite surface of the submount; and
a soft solder layer bonded to the metal layer and coupled to the heatsink so that a temperature of a p-n junction of the diode laser remains substantially constant through a predetermined amount of repeated thermo-cycles of up to at least several hundred cycles with a temperature differential $\Delta T$ within each cycle exceeding one hundred ° C.

2. The mount of claim 1, wherein the temperature of the p-n junction remains constant in a 0 to 2° C. temperature range over the predetermined amount of repeated thereto-cycles.

3. The mount of claim 2, wherein the temperature of the p-n junction remains below 1° C. over the predetermined amount of repeated thermo-cycles.

4. A multi-layer laser diode mount comprising:
a submount having one surface supporting a diode laser and an opposite surface;
a heatsink spaced from and facing the opposite surface of the submount, the submount and heatsink being configured with respective thermal expansion coefficients ("TEC") differing from one another;
a metal layer deposited over and in contact with the opposite surface of the submount;
a spacer located between and spaced from the metal layer and heatsink and made from material with a TEC matching that of the submount;
a soft solder layer binding the metal layer and spacer; and
a hard solder layer located between and bonded to the spacer and heatsink, wherein the soft solder layer providing a p-n junction of the diode laser with a substantially constant temperature through a predetermined amount of repeated thermo-cycles of up to at least several hundred cycles with a temperature differential $\Delta T$ within each cycle exceeding one hundred ° C.

5. The mount of claim 1, wherein the metal layer has a thickness reaching hundreds of microns.

6. The mount of claim 5, wherein the metal layer terminates at a distance from a periphery of the opposite surface of the submount.

* * * * *